United States Patent
Lee et al.

(10) Patent No.: US 9,711,756 B2
(45) Date of Patent: Jul. 18, 2017

(54) ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Jeong-Yeol Lee, Yongin (KR); Gyoo-Chul Jo, Yongin (KR); Keun-Rim Ku, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/612,210

(22) Filed: Feb. 2, 2015

(65) Prior Publication Data

US 2015/0144933 A1    May 28, 2015

Related U.S. Application Data

(63) Continuation of application No. 13/673,923, filed on Nov. 9, 2012, now Pat. No. 8,946,691.

(30) Foreign Application Priority Data

Jul. 11, 2012  (KR) .................. 10-2012-0075750

(51) Int. Cl.
*H01L 23/31*  (2006.01)
*H01L 51/52*  (2006.01)
(Continued)

(52) U.S. Cl.
CPC ...... *H01L 51/5253* (2013.01); *H01L 27/3244* (2013.01); *H01L 51/5088* (2013.01);
(Continued)

(58) Field of Classification Search
CPC .................................................. H01L 51/5253
(Continued)

(56) References Cited

U.S. PATENT DOCUMENTS 5,844,363 A * 12/1998  Gu ...................... H01L 51/5012
                                                      313/506
7,960,910 B2    6/2011  Suh
(Continued)

FOREIGN PATENT DOCUMENTS

KR  10-2007-0111002   11/2007
KR  10-2009-0116199   11/2009
(Continued)

*Primary Examiner* — Cuong Q Nguyen
*Assistant Examiner* — Nishath Yasmeen
(74) *Attorney, Agent, or Firm* — Lewis Roca Rothgerber Christie LLP

(57) ABSTRACT

An organic light-emitting display apparatus includes: a substrate; a pixel electrode disposed on the substrate; an intermediate layer that is disposed on the pixel electrode and includes an organic light-emitting layer; a facing electrode disposed on the intermediate layer; and a thin film encapsulating layer disposed on the facing electrode, wherein the thin film encapsulating layer includes: a first inorganic film and a second inorganic film, which are disposed on the facing electrode; a first organic film that is disposed between the first inorganic film and the second inorganic film and has a first thickness; and a second organic film that is disposed on the second inorganic film and has a second thickness greater than the first thickness.

10 Claims, 5 Drawing Sheets

(51) Int. Cl.
*H01L 51/50* (2006.01)
*H01L 51/56* (2006.01)
*H01L 27/32* (2006.01)

(52) U.S. Cl.
CPC ...... *H01L 51/5203* (2013.01); *H01L 51/5256* (2013.01); *H01L 51/56* (2013.01); *H01L 27/3246* (2013.01); *H01L 2251/558* (2013.01)

(58) Field of Classification Search
USPC ......... 257/40, 59, 72, 79–83, 100, 431, 433, 257/E23.134, E23.123, E21.502, E33.059; 313/504, 513
See application file for complete search history.

(56) References Cited

U.S. PATENT DOCUMENTS

| | | | |
|---|---|---|---|
| 2003/0203210 A1* | 10/2003 | Graff | H01L 51/0097 428/412 |
| 2004/0018305 A1 | 1/2004 | Pagano et al. | |
| 2004/0195960 A1 | 10/2004 | Czeremuszkin et al. | |
| 2006/0001040 A1 | 1/2006 | Kim et al. | |
| 2006/0062937 A1* | 3/2006 | Padiyath | B32B 27/08 428/1.33 |
| 2007/0267973 A1 | 11/2007 | Suh | |
| 2009/0278449 A1 | 11/2009 | Choi et al. | |
| 2010/0007270 A1* | 1/2010 | Suh | H01L 27/322 313/504 |
| 2010/0134426 A1* | 6/2010 | Lee | G06F 3/0412 345/173 |
| 2011/0120755 A1 | 5/2011 | Lee et al. | |
| 2011/0163330 A1* | 7/2011 | Kim | H01L 51/5256 257/88 |
| 2014/0370228 A1* | 12/2014 | Wei | H01J 1/88 428/76 |

FOREIGN PATENT DOCUMENTS

| | | |
|---|---|---|
| KR | 10-2010-0061121 | 6/2010 |
| KR | 10-2011-0057985 | 6/2011 |

* cited by examiner

ORGANIC LIGHT-EMITTING DISPLAY APPARATUS AND METHOD OF MANUFACTURING THE SAME

CROSS-REFERENCE TO RELATED PATENT APPLICATION

This application is a continuation of U.S. patent application Ser. No. 13/673,923, filed Nov. 9, 2012, which claims priority to and the benefit of Korean Patent Application No. 10-2012-0075750, filed Jul. 11, 2012, the entire content of both of which is incorporated herein by reference.

BACKGROUND

1. Field

The following description relates to an organic light-emitting display apparatus and a method of manufacturing the same.

2. Description of the Related Art

An organic light-emitting display apparatus includes an organic light-emitting device. The organic light-emitting device includes a hole injection electrode, an electron injection electrode, and an organic light-emitting layer formed therebetween. The organic light-emitting display apparatus is an emissive type display apparatus that generates light when an energy state of exitons generated by combinations of holes injected from the hole injection electrode with electrons injected from the electron injection electrode in the organic light-emitting layer drops to a ground state from an excited state.

The organic light-emitting display apparatus does not require an additional light source, may be operated at a low voltage, may have a light weight thin film structure, and has a wide viewing angle, high contrast, and short response time, and thus, is considered to be a next generation display device.

However, the characteristics of the organic light-emitting display apparatus may be degraded by penetration of external moisture or oxygen. Thus, the organic light-emitting display apparatus is sealed to protect it from external moisture or oxygen.

Recently, in order to manufacture a thin and/or flexible organic light-emitting display apparatus, thin film encapsulation (TEE) formed of a plurality of layers that include a plurality of inorganic films or organic films and inorganic films is used to seal the organic light-emitting display apparatus.

However, a gas generated from the organic films included in the TFE penetrates into the organic light-emitting display apparatus, and thus, the lifetime of the organic light-emitting display apparatus is reduced.

SUMMARY

Aspects of embodiments of the present invention are directed toward an organic light-emitting display apparatus that has an extended lifetime and a method of manufacturing the same.

According to an embodiment of the present invention, there is provided an organic light-emitting display apparatus including: a substrate; a pixel electrode disposed on the substrate; an intermediate layer that is disposed on the pixel electrode and includes an organic light-emitting layer; a facing electrode disposed on the intermediate layer; and a thin film encapsulating layer disposed on the facing electrode, wherein the thin film encapsulating layer includes: a first inorganic film and a second inorganic film, which are disposed on the facing electrode; a first organic film that is disposed between the first inorganic film and the second inorganic film and has a first thickness; and a second organic film that is disposed on the second inorganic film and has a second thickness greater than the first thickness.

The first thickness may be 1.5 µm or less.

In one embodiment, the organic light-emitting display apparatus further includes a pixel defining film that defines a pixel region and is disposed to cover both edge regions of the pixel electrode, wherein the intermediate layer is disposed in the pixel region and a step difference is generated between the pixel region and a non-pixel region outside of the pixel region.

The first inorganic film, the first organic film, and the second inorganic film may be disposed in the pixel region and the non-pixel region along the step difference and the second organic film may be disposed to planarize the step difference.

In one embodiment, the thin film encapsulating layer further includes a third inorganic film disposed on the second organic film and a third organic film that is disposed on the third inorganic film and has a third thickness greater than the first thickness.

The first inorganic film, the first organic film, the second inorganic film, the second organic film, and the third inorganic film may be disposed in the pixel region and the non-pixel region along the step difference, and the third organic film may be disposed to planarize the step difference.

The first inorganic film, the first organic film, and the second inorganic film may be disposed in the pixel region and the non-pixel region along the step difference, and the second organic film and the third organic film may be disposed to planarize the step difference.

The thin film encapsulating layer may further include a plurality of additional inorganic films and organic films alternately disposed on the third organic film.

The organic light-emitting display apparatus may further include a protection layer disposed between the facing electrode and the thin film encapsulating layer.

The substrate may be a flexible substrate.

The organic light-emitting display apparatus may further include an optical member disposed on the thin film encapsulating layer.

According to an embodiment of the present invention, there is provided a method of manufacturing an organic light-emitting display apparatus, the method including: sequentially forming a pixel electrode, an intermediate layer that includes an organic light-emitting layer, and a facing electrode on a substrate; and forming a thin film encapsulating layer on the facing electrode, wherein the forming of the thin film encapsulating layer includes: forming a first inorganic film on the facing electrode; forming a first organic film having a first thickness on the first inorganic film; forming a second inorganic film on the first organic film; and forming a second organic film having a second thickness greater than the first thickness on the second inorganic film.

The forming of the first organic film may include forming the first organic film to have the first thickness of 1.5 µm or less.

In one embodiment, the sequentially forming of the pixel electrode, the intermediate layer that includes an organic light-emitting layer, and the facing electrode on the substrate may include: forming the pixel electrode on the substrate; forming the pixel defining film that defines a pixel region and covers both edge regions of the pixel electrode; forming the intermediate layer that includes an organic light-emitting layer in the pixel region defined by the pixel defining film; and forming the facing electrode to cover the intermediate layer and the pixel defining film, wherein a step difference is formed between the pixel region and a non-pixel region outside of the pixel region.

The forming of the first inorganic film, the first organic film, and the second inorganic film may include forming the first inorganic film, the first organic film, and the second inorganic film in the pixel region and the non-pixel region along the step difference, and the forming of the second organic film may include forming the second organic film to planarize the step difference.

The forming of the thin film encapsulating layer may further include: after forming the second organic film, forming a third inorganic film on the second organic film; and forming the third organic film having a third thickness greater than the first thickness on the third inorganic film.

The forming of the first inorganic film, the first organic film, the second inorganic film, the second organic film, and the third inorganic film may include forming the first inorganic film, the first organic film, the second inorganic film, the second organic film, and the third inorganic film in the pixel region and the non-pixel region along the step difference, and the forming of the third organic film may include forming the third organic film to planarize the step difference.

The forming of the first inorganic film, the first organic film, and the second inorganic film may include forming the first inorganic film, the first organic film, and the second inorganic film in the pixel region and the non-pixel region along the step difference, and the forming of the second organic film and the third organic film may include forming the second organic film and the third inorganic film to planarize the step difference.

The forming of the thin film encapsulating layer may further include forming a plurality of additional inorganic films and organic films alternately formed on the third organic film.

The method may further include forming a protection layer on the facing electrode before forming the thin film encapsulating layer.

According to the organic light-emitting display apparatus and the method of manufacturing the same according to embodiments of the present invention, the lifetime of the organic light-emitting display apparatus may be increased by minimizing the thickness of the first organic film included in the thin film encapsulating layer.

Also, the occurrence of black spots may be reduced by planarizing a step difference caused by the pixel defining film. For this purpose, the second organic film or the third organic film may be formed to have a thickness greater than that of the first organic film.

Also, a flexible organic light-emitting display apparatus may be realized by employing the flexible substrate and the thin film encapsulating layer as a sealing device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will be described more fully with reference to the accompanying drawings, in which exemplary embodiments of the present invention are shown.

Figure 1:
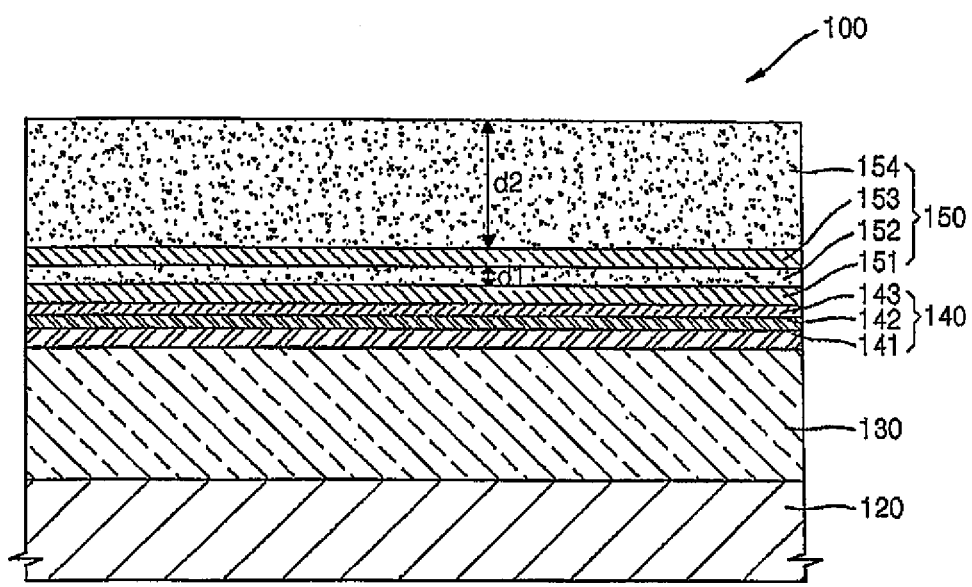
FIG. 1 is a schematic cross-sectional view of an organic light-emitting display apparatus according to an embodiment of the present invention.
Figure 2:
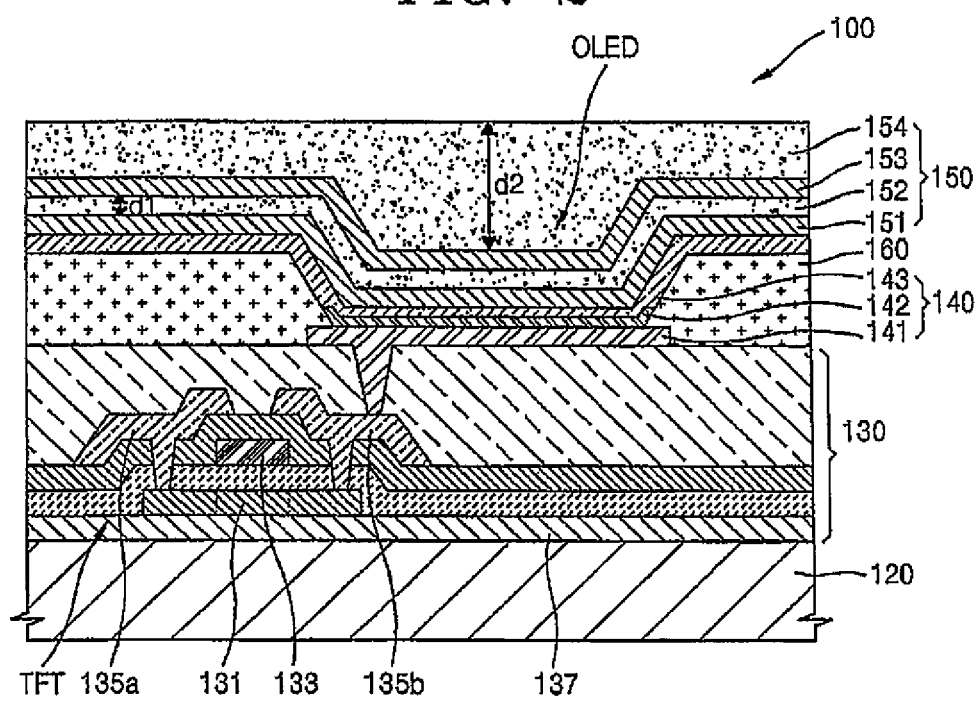
FIG. 2 is a schematic cross-sectional view of a pixel region of the organic light-emitting display apparatus of FIG. 1, according to an embodiment of the present invention.

FIG. 1 is a schematic cross-sectional view of an organic light-emitting display apparatus 100 according to an embodiment of the present invention. FIG. 2 is a schematic cross-sectional view of a pixel region of the organic light-emitting display apparatus of FIG. 1.

Referring to FIGS. 1 and 2, the organic light-emitting display apparatus 100 includes a substrate 120, a device/wiring layer 130 formed on the substrate 120, a pixel electrode 141 disposed on the device/wiring layer 130, an intermediate layer 142 that is disposed on the pixel electrode 141 and includes an organic light-emitting layer, a facing electrode 143 disposed on the intermediate layer 142, and a thin film encapsulating layer 150 disposed on the facing electrode 143.

The thin film encapsulating layer 150 includes a first inorganic film 151 disposed on the facing electrode 143, a first organic film 152 that is disposed on the first inorganic film 151 and has a first thickness d1, a second inorganic film 153 disposed on the first organic film 152, and a second organic film 154 that is disposed on the second inorganic film 153 and has a second thickness d2.

The substrate 120 may be a flexible substrate, and may be formed of a high heat resistant and high durability plastic selected from the group consisting of polyimide, polyethylene terephthalate (PET), polycarbonate, polyethylene naphtalate, polyarylate (PAR), and polyetherimide. However, the present invention is not limited thereto, and the substrate 120 may be formed of various materials such as a metal or glass.

The device/wiring layer 130 may be formed on the substrate 120. The device/wiring layer 130 may include a driving thin film transistor (TFT) that drives an organic light-emitting device (OLED) 140, a switching TFT, a capacitor, or wirings connected to the driving TFT or the capacitor.

The driving TFT includes an active layer 131, a gate electrode 133, and source and drain electrodes 135a and 135b.

A barrier film 137 may be disposed between the substrate 120 and the device/wiring layer 130 to prevent an external material such as moisture or oxygen from penetrating into the device/wiring layer 130 and the OLED 140 through the substrate 120.

The OLED 140 is disposed on the device/wiring layer 130. The OLED 140 includes the pixel electrode 141, the intermediate layer 142 that includes an organic light-emitting layer and is disposed on the pixel electrode 141, and the facing electrode 143 disposed on the intermediate layer 142.

In the current embodiment, the pixel electrode 141 is an anode electrode, and the facing electrode 143 is a cathode electrode. However, the present invention is not limited thereto, and the pixel electrode 141 may be a cathode electrode and the facing electrode 143 may be an anode electrode according to the driving method of the organic light-emitting display apparatus 100.

Holes and electrons are respectively injected from the pixel electrode 141 and the facing electrode 143 into the organic light-emitting layer included in the intermediate layer 142. Light is emitted when an energy state of exitons that are formed by combinations of the holes and electrons is changed from an excited state to a ground state.

The pixel electrode 141 is electrically connected to the driving TFT formed on the device/wiring layer 130.

In the current embodiment, a structure in which the OLED 140 is disposed on the device/wiring layer 130 on which the driving TFT is disposed is described, but the structure is not limited thereto. For example, a structure in which the pixel electrode 141 of the OLED 140 and the active layer 131 of the TFT are formed on the same layer, a structure in which the pixel electrode 141 and the gate electrode 133 of the TFT are formed on the same layer, or a structure in which the pixel electrode 141 and the source and drain electrodes 135a and 135b are formed on the same layer may be used.

Also, in the driving TFT according to the current embodiment, the gate electrode 133 is disposed on the active layer 131. However, the present invention is not limited thereto, and the gate electrode 133 may be disposed under the active layer 131.

The pixel electrode 141 included in the OLED 140 according to the current embodiment may be a reflective electrode, and may include a reflection film formed of a material selected from the group consisting of Ag, Mg, Al, Pt, Pd, Au, Ni, Nd, Ir, Cr, and a compound of these materials and a transparent or semi-transparent electrode formed on the reflection film.

The transparent or semi-transparent electrode may include at least one selected from the group consisting of indium tin oxide (ITO), indium zinc oxide (IZO), zinc oxide (ZnO), indium oxide (In2O3), indium gallium oxide (IGO), and aluminum zinc oxide (AZO).

The facing electrode 143 facing the pixel electrode 141 may be a transparent or semi-transparent electrode, and may be formed of a metal thin film that has a small work function and includes a metal selected from the group consisting of Li, Ca, LiF/Ca, LiF/Al, Al, Ag, Mg, and a compound of these metals. Also, an auxiliary electrode or a bus electrode may further be formed on the metal thin film. The auxiliary electrode or a bus electrode may be formed of a transparent material for forming an electrode, such as ITO, IZO, ZnO, or $In_2O_3$.

Accordingly, the facing electrode 143 may transmit light emitted from the organic light-emitting layer included in the intermediate layer 142.

The organic light-emitting layer may be a low molecular weight organic material or a polymer organic material. The intermediate layer 142 may further optionally include a functional layer such as a hole transport layer (HTL), a hole injection layer (HIL), an electron transport layer (ETL), and an electron injection layer (EIL) besides the organic light-emitting layer.

The organic light-emitting display apparatus 100 may be a top emission type apparatus in which light emitted from the organic light-emitting layer may be emitted towards the facing electrode 143 directly or after being reflected by the pixel electrode 141.

However, the organic light-emitting display apparatus 100 according to the current embodiment is not limited to the top emission type apparatus, and may be a bottom emission type apparatus in which light emitted from the organic light-emitting layer is emitted towards the substrate 120. In this case, the pixel electrode 141 is formed as a transparent or semi-transparent electrode, and the facing electrode 143 may be formed as a reflection electrode.

Also, the organic light-emitting display apparatus 100 according to the current embodiment may be a dual-side emission type apparatus in which light is emitted to a top direction and to a bottom direction.

The thin film encapsulating layer 150 is disposed on the facing electrode 143, and the thin film encapsulating layer 150 may include the first inorganic film 151, the first organic film 152, the second inorganic film 153, and the second organic film 154.

The first organic film 152 may have a first thickness d1, and the second organic film 154 may have a second thickness d2 which is greater than the first thickness d1.

According to the current embodiment, the substrate 120 is a flexible substrate, and the thin film encapsulating layer 150 is included as a sealing member, and thus, the organic light-emitting display apparatus 100 having a flexible and thin film structure may be readily realized. Also, the thin film encapsulating layer 150 is disposed to directly cover the OLED 140, and thus, protects the OLED 140 from external factors. An additional layer such as a protective layer 170 (refer to FIG. 3) may further be formed between the thin film encapsulating layer 150 and the OLED 140. However, a filler that is required for sealing a glass substrate is not required.

The first inorganic film 151 and the second inorganic film 153 may be formed of a material selected from the group consisting of a metal oxide, a metal nitride, a metallic carbide, and a compound formed of these materials, for example, aluminum oxide, silicon oxide, or a silicon nitride. The first inorganic film 151 and the second inorganic film 153 prevent external moisture or oxygen from penetrating into the OLED 140.

The first organic film 152 and the second organic film 154 may be formed of a polymer organic compound, for example, may include acrylate or urethane acrylate.

The first and second organic films 152 and 154 reduce internal stress of the first and second inorganic films 151 and 153 or compensate for defects of and planarize the first and second inorganic films 151 and 153.

The first and second organic films 152 and 154 included in the organic light-emitting display apparatus 100 according to the current embodiment have thicknesses different from each other, and the second organic film 154 has a thickness d2 greater than the thickness d1 of the first organic film 152.

Referring to FIG. 2, a pixel defining film 160 is disposed on both edge regions of the pixel electrode 141 included in the OLED 140, and the intermediate layer 142 is disposed in the region defined by the pixel defining film 160. A step difference is formed by the pixel defining film 160 having a set or predetermined thickness between a pixel region and a non-pixel region outside of the pixel region.

The facing electrode 143 is disposed along the step difference to cover the pixel defining film 160 and the intermediate layer 142, and the thin film encapsulating layer 150 that seals the OLED 140 is disposed on the facing electrode 143.

At this point, the first inorganic film 151, the first organic film 152, and the second inorganic film 153, which are disposed on a lower side of the thin film encapsulating layer 150, are sequentially disposed on the facing electrode 143 along the step difference.

In general, organic films included in a thin film encapsulating layer are formed to have a set or predetermined thickness to have a planarizing function. However, the first organic film 152 included in organic light-emitting display apparatus 100 according to the current embodiment is formed to have a thickness d1, not thick enough to perform a planarizing function.

The first organic film 152 may be formed of a polymer organic compound, and at this point, an outgassing phenomenon may occur in the polymer organic compound, and the gas generated from the polymer organic compound may penetrate towards the OLED 140.

Although the first inorganic film 151 is disposed between the OLED 140 and the first organic film 152, since the first inorganic film 151 is formed along the step difference caused by the pixel defining film 160, the first inorganic film 151 may not completely block the penetration of a gas generated from the first organic film 152 into the OLED 140.

Accordingly, the OLED 140 may be degraded by the infiltrated gas, and as a result, the lifetime of the organic light-emitting display apparatus 100 is reduced.

However, the first organic film 152 included in the organic light-emitting display apparatus 100 according to the current embodiment is formed to have a very thin thickness d1. The first organic film 152 may reduce or minimize the discharge of gas, and thus, may increase the lifetime of the organic light-emitting display apparatus 100.

The thickness d1 of the first organic film 152 may be 1.5 μm or less, which will be described below.

The second inorganic film 153 and the second organic film 154 are disposed on the first organic film 152. The second organic film 154 has a thickness d2 thick enough to planarize the step difference caused by the pixel defining film 160.

If the step difference caused by the pixel defining film 160 is not planarized by the thin film encapsulating layer 150, the thin film may be damaged by an external pressure, which may lead to occurrence of black spots in the organic light-emitting display apparatus.

In the organic light-emitting display apparatus 100 according to the current embodiment, the first organic film 152 is formed to have a thickness d1, not thick enough to perform a planarizing function but to minimize the discharge of the gas. Accordingly, in order to prevent the occurrence of black spots, the second organic film 154 is formed to have a thickness d2, thick enough to planarize the step difference.

Accordingly, the lifetime of the organic light-emitting display apparatus 100 may be increased and the occurrence of black spots may be prevented.

Figure 3:
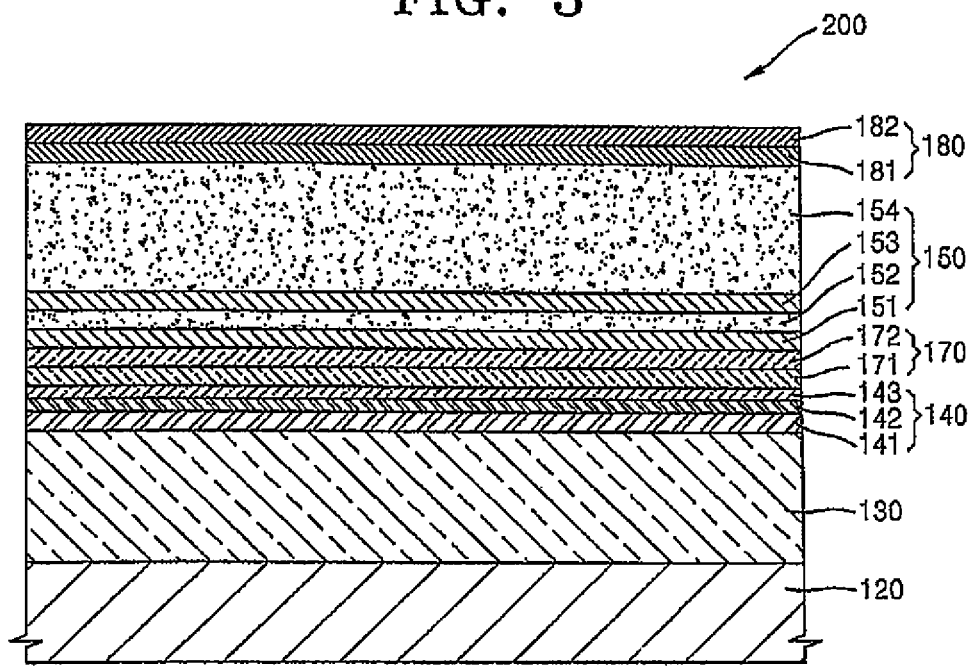
FIG. 3 is a schematic cross-sectional view of an organic light-emitting display apparatus according to another embodiment of the present invention.

FIG. 3 is a schematic cross-sectional view of an organic light-emitting display apparatus 200 according to another embodiment of the present invention.

The organic light-emitting display apparatus 200 according to the current embodiment will be described mainly with regard to the differences between the organic light-emitting display apparatus 200 and the organic light-emitting display apparatus 100 of FIGS. 1 and 2.

Referring to FIG. 3, the organic light-emitting display apparatus 200 has the same structure as the organic light-emitting display apparatus 100 of FIGS. 1 and 2 except that the protection layer 170 is disposed between the facing electrode 143 and the thin film encapsulating layer 150 and an optical member 180 is disposed on the thin film encapsulating layer 150.

The protection layer 170 may include a capping layer 171 and a blocking layer 172. The capping layer 171 may be formed of an organic material selected from the group consisting of a-NPD, NPB, TPD, m-MTDATA, Alq3, and CuPc, and may protect the OLED 140 and help light generated from the OLED 140 to be effectively emitted.

The blocking layer 172 may be formed of an inorganic material selected from the group consisting of LiF, MgF2, and CaF2, and blocks plasma used in a process of forming the thin film encapsulating layer 150 from penetrating into the OLED 140 since the plasma may damage the intermediate layer 142 and the facing electrode 143.

The optical member 180 may be disposed on the thin film encapsulating layer 150. The optical member 180 may include a phase retarder 181 and a polarizer 182, and the phase retarder 181 may be a λ/4 plate.

The optical member 180 according to the current embodiment increases visibility and contrast of the organic light-emitting display apparatus 200.

Figure 4:
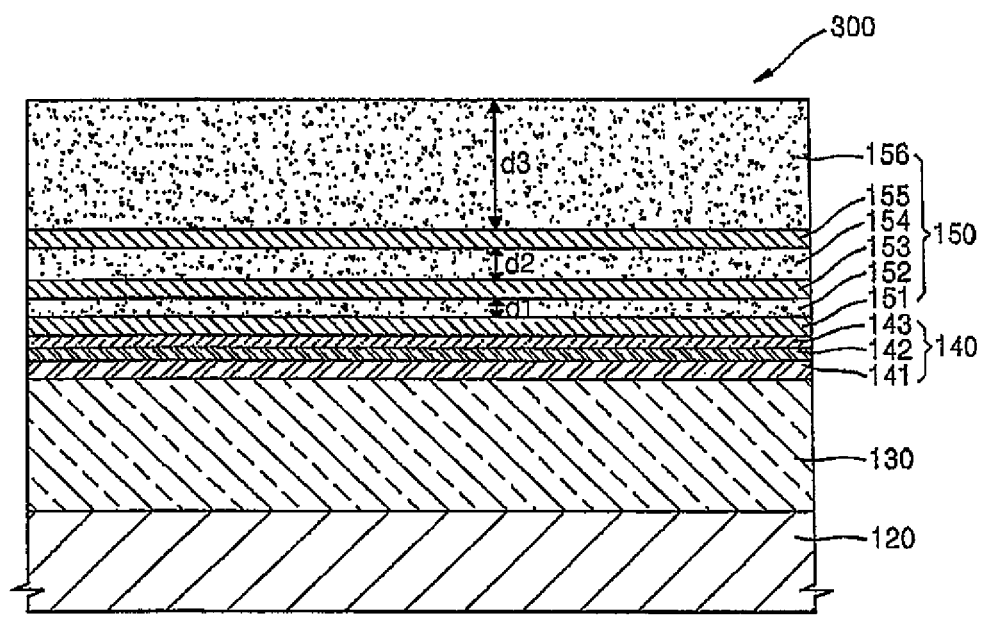
FIG. 4 is a schematic cross-sectional view of an organic light-emitting display apparatus according to another embodiment of the present invention.

FIG. 4 is a schematic cross-sectional view of an organic light-emitting display apparatus 300 according to another embodiment of the present invention.

Referring to FIG. 4, the organic light-emitting display apparatus 3 has the same structure as the organic light-emitting display apparatus 100 of FIGS. 1 and 2 except that the thin film encapsulating layer 150 further includes a third inorganic film 155 and a third organic film 156 having a third thickness d3 greater than the first thickness d1 of the first organic film 152 on the third inorganic film 155.

The organic light-emitting display apparatus 300 according to the current embodiment includes the first inorganic film 151, the first organic film 152, the second inorganic film 153, the second organic film 154, and the third inorganic film 155, which are disposed in the pixel region and the non-pixel region along a step difference caused by the pixel defining film 160, and the third organic film 156 having a third thickness d3 is disposed on the third inorganic film 155.

That is, the first and second organic films 152 and 154 are formed to have thicknesses not thick enough to planarize the step difference caused by the pixel defining film 160, and the third organic film 156 planarizes the step difference caused by the pixel defining film 160.

The outgassing phenomenon, that is, the discharge of a gas from the first and second organic films 152 and 154 may be reduced or minimized by the above configuration, and a gas discharged from the third organic film 156 is effectively blocked by the first inorganic film 151, the second inorganic film 153, and the third inorganic film 155. Accordingly, the degradation of the intermediate layer 142 by the gas penetration into the OLED 140 may be reduced.

Accordingly, the lifetime of the organic light-emitting display apparatus 300 may be increased, and the occurrence of black spots in the organic light-emitting display apparatus 300 may also be prevented since the step difference caused by the pixel defining film 160 is planarized by the third organic film 156.

Figure 5:
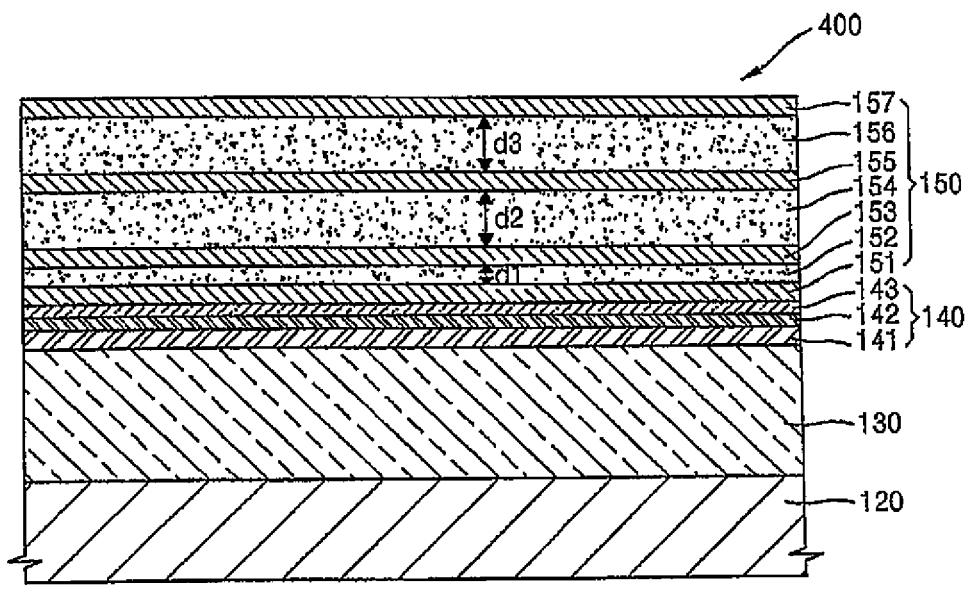
FIG. 5 is a schematic cross-sectional view of an organic light-emitting display apparatus according to another embodiment of the present invention.

FIG. 5 is a schematic cross-sectional view of an organic light-emitting display apparatus 400 according to another embodiment of the present invention.

Referring to FIG. 5, the organic light-emitting display apparatus 300 has the same structure as the organic light-emitting display apparatus 100 of FIGS. 1 and 2 except that the thin film encapsulating layer 150 further includes a third inorganic film 155 disposed on the second organic film 154, and a third organic film 156 having a third thickness d3 greater than the first thickness d1 of the first organic film 152 on the third inorganic film 155, and a fourth inorganic film 157 disposed on the third organic film 156.

The organic light-emitting display apparatus 400 according to the current embodiment includes the first inorganic film 151, the first organic film 152, and the second inorganic film 153, which are disposed in the pixel region and the non-pixel region along a step difference caused by the pixel defining film 160, and the second organic film 154 and the third organic film 156 respectively having set or predetermined thicknesses d2 and d3 are disposed on the second inorganic film 153. The third inorganic film 155 is disposed between the second organic film 154 and the third organic film 156.

That is, the first organic film 152 is formed to have a thickness d1, not thick enough to planarize the step difference caused by the pixel defining film 160, and the step difference may be planarized by the second organic film 154 and the third organic film 156.

The outgassing phenomenon, that is, the discharge of a gas from the first organic film 152, may be reduced or minimized by the above configuration, and the thicknesses of the second organic film 154 and the third organic film 156 may be selected in consideration of the increase in the lifetime and the reduction of occurrence of black spots of the organic light-emitting display apparatus 400.

The organic light-emitting display apparatus 400 according to the current embodiment may further include a fourth inorganic film 157 on the third organic film 156. That is, the penetration of external moisture or oxygen may further be blocked by disposing an inorganic film on an outermost side of the thin film encapsulating layer 150.

However, the organic light-emitting display apparatus according to the present invention is not limited to the structures of the organic light-emitting display apparatuses 100, 200, 300, and 400 respectively shown in FIGS. 1, 3, 4, and 5. That is, the organic light-emitting display apparatus according to the present invention may further include a plurality of additional inorganic films and organic films, which are alternately disposed on the second organic film 154 or the third organic film 156, and at this point, the number of stacking of the inorganic films and the organic films are not limited.

Also, an organic film or an inorganic film may be disposed on an outermost side of the thin film encapsulating layer 150.

Also, in the organic light-emitting display apparatuses 100, 300, and 400 of FIGS. 1, 4, and 5, the protection layer 170 may be disposed between the OLED 140 and the thin film encapsulating layer 150 as in the organic light-emitting display apparatus 200 of FIG. 3, and the optical member 180 may be disposed on the thin film encapsulating layer 150.

A method of manufacturing the organic light-emitting display apparatus 100 according to an embodiment of the present invention will now be described.

Figure 6:
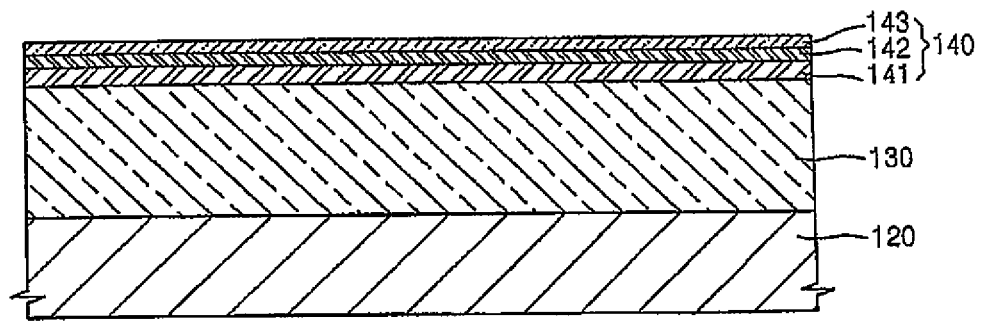
FIGS. 6 through 8 are sequential cross-sectional views showing a method of manufacturing the organic light-emitting display apparatus of FIG. 1, according to an embodiment of the present invention.
Figure 7:
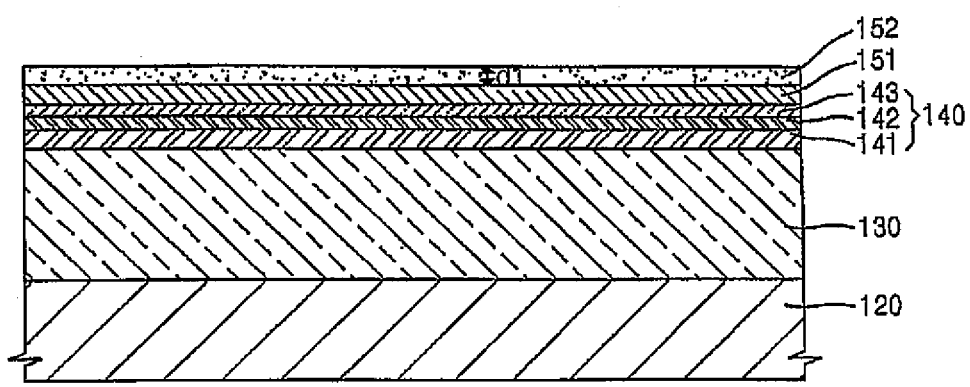
Figure 8:
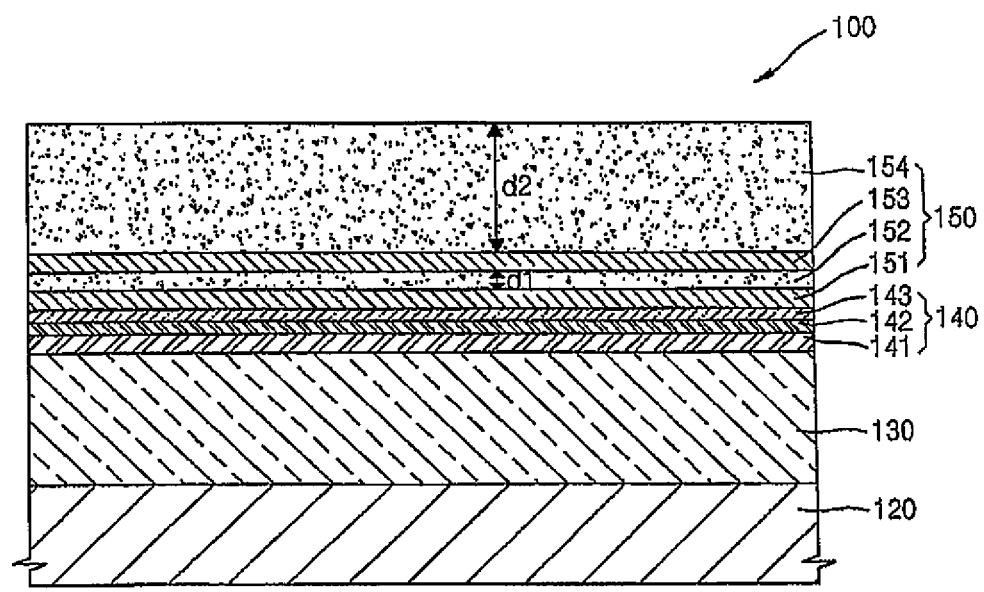

FIGS. 6 through 8 are sequential cross-sectional views showing a method of manufacturing the organic light-emitting display apparatus 100 of FIG. 1, according to an embodiment of the present invention.

Referring to FIG. 6, the device/wiring layer 130 and the OLED 140 that includes the pixel electrode 141, the intermediate layer 142 that includes an organic light-emitting layer, and the facing electrode 143 are formed on the substrate 120.

The substrate 120 may be a flexible substrate that may be disposed on a carrier substrate formed of a material such as glass that supports the flexible substrate. The carrier substrate may be removed in the course of processes or after all of the processes are completed.

As described above, the substrate 120 may be formed of a plastic having a high thermal resistance and durability. However, the present invention is not limited thereto, and the substrate 120 may be formed of various materials such as a metal or glass.

The device/wiring layer 130 may include the driving TFT (refer to FIG. 2) that drives the OLED 140, a capacitor, and wirings.

The pixel electrode 141, the intermediate layer 142, and the facing electrode 143 are sequentially formed on the device/wiring layer 130.

The pixel electrode 141 may not necessarily be a reflection electrode, and the facing electrode 143 may be a transparent or semi-transparent electrode. Accordingly, light emitted from the organic light-emitting layer included in the intermediate layer 142 may be emitted towards the facing electrode 143 directly or after being reflected by the pixel electrode 141.

A resonance structure may be realized by the pixel electrode 141 and the facing electrode 143 by forming the facing electrode 143 as a semi-transparent electrode.

However, the organic light-emitting display apparatus 100 according to the current embodiment is not limited thereto. Thus, the organic light-emitting display apparatus 100 may be configured to emit light towards the substrate 120 by forming the pixel electrode 141 as a transparent or semi-transparent electrode and the facing electrode 143 as a reflection electrode.

The organic light-emitting layer included in the intermediate layer 142 may be formed of a low molecular weight organic material or a polymer organic material. Also, a functional layer as described above may be optionally formed between the pixel electrode 141 and the facing electrode 143 besides the organic light-emitting layer.

In the current embodiment, the OLED 140 is disposed on the device/wiring layer 130. However, the present invention is not limited thereto, and the device/wiring layer 130 and the OLED 140 may be formed on the same layer.

Referring to FIG. 7, the first inorganic film 151 and the first organic film 152 are formed on the OLED 140.

At this point, the first inorganic film 151 may be formed of a material selected from the group consisting of a metal oxide, a metal nitride, a metallic carbide, and a compound of these materials, for example, aluminum oxide, silicon oxide, or silicon nitride. The first organic film 152 may be formed of a polymer organic compound selected from the group consisting of epoxy, acrylate, and urethane acrylate.

Here, as described above, the first organic film 152 is formed to have a thickness d1 which is not thick enough to planarize a step difference caused by the pixel defining film 160 (refer to FIG. 2) for reducing or minimizing a gas discharge phenomenon. The first organic film 152 may have a thickness d1 of 1.5 μm or less.

Referring to FIG. 8, the second inorganic film 153 and the second organic film 154 are formed on the first organic film 152.

The second inorganic film 153 may be formed of a material selected from the group consisting of a metal oxide, a metal nitride, a metallic carbide, and a compound of these materials, or may be formed of the same material used to form the first inorganic film 151.

The second organic film 154 may be a polymer organic compound, and may be formed to have a thickness d2 which is thick enough to planarize a step difference caused by the pixel defining film 160 (refer to FIG. 2) for reducing or minimizing the occurrence of black spots in the organic light-emitting display apparatus 100. The second organic film 154 may have a thickness d2 greater than the thickness d1 of the first organic film 152.

Figure 9:
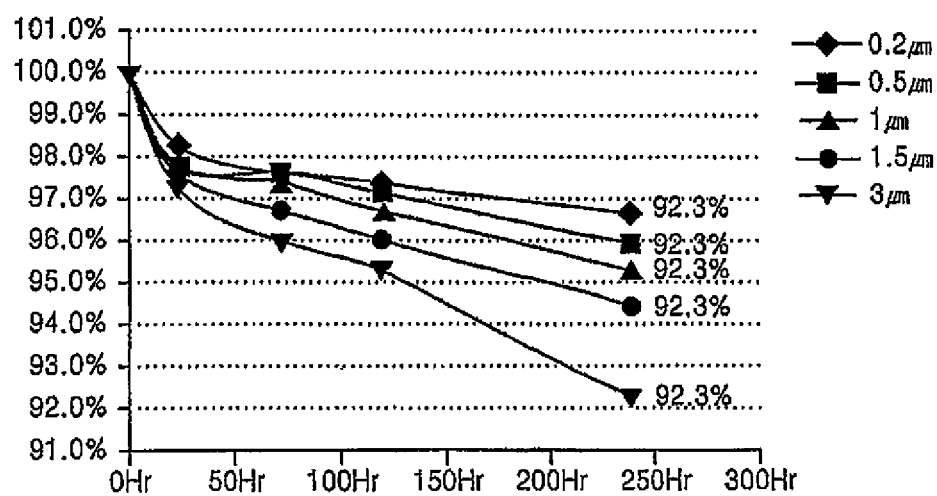
FIG. 9 is a graph showing changes of brightness of light according to time in the organic light-emitting display apparatus.
Figure 10:
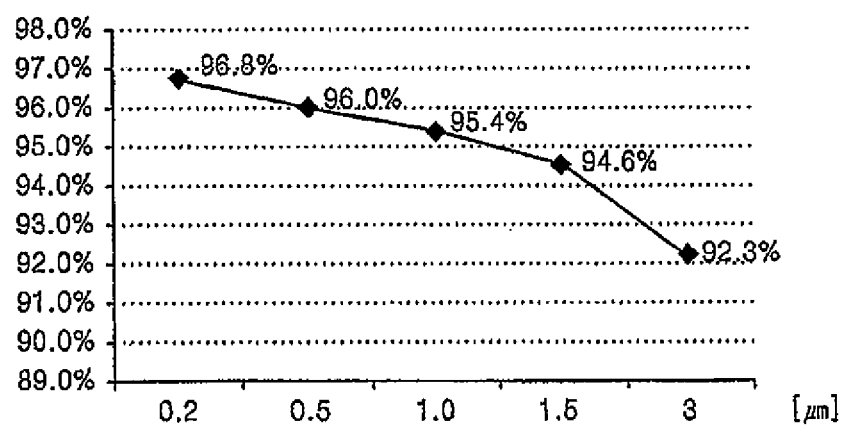
FIG. 10 is a graph showing the degree of brightness reduction according to the thickness of a first organic film in the organic light-emitting display apparatus according to an embodiment of the present invention.

FIG. 9 is a graph showing the changes of brightness of light according to time in the organic light-emitting display apparatus 100. FIG. 10 is a graph showing the degree of brightness reduction according to the thickness d1 of the first organic film 152 in the organic light-emitting display apparatus 100 according to an embodiment of the present invention.

FIG. 9 shows the changes of brightness reduction (vertical axis) according to time (horizontal axis) when the thicknesses d1 of the first organic film 152 are 0.2 μm, 0.5 μm, 1 μm, 1.5 μm, and 3 μm, respectively.

FIG. 9 shows measuring results of changes of brightness reduction of the organic light-emitting display apparatus 100 at room temperature as the room temperature is an important factor for determining the lifetime of the organic light-emitting display apparatus 100.

From the graph of FIG. 9, it is confirmed that, as the thickness d1 of the first organic film 152 is increased, brightness is rapidly reduced according to time. That is, the lifetime of the organic light-emitting display apparatus 100 is reduced.

FIG. 10 shows the degree of brightness reduction (vertical axis) after 240 hours at room temperature when the thicknesses d1 of the first organic film 152 are 0.2 μm, 0.5 μm, 1 μm, 1.5 μm, and 3 μm, respectively.

From the graph of FIG. 10, it is confirmed that, as the thickness d1 of the first organic film 152 is increased, the brightness is remarkably reduced after 240 hours of elapsed time. When the thickness d1 of the first organic film 152 is 3 μm, the brightness value is reduced to 92.3%.

Accordingly, the first organic film 152 may be formed to have a thickness d1 of 1.5 μm or less in consideration of the manufacturing process of the first organic film 152 and the degree of brightness reduction.

As described above, according to the organic light-emitting display apparatuses 100, 200, 300, and 400 according to the embodiments of the present invention, the lifetime of the organic light-emitting display apparatuses 100, 200, 300, and 400 may be increased by reducing the thickness d1 of the first organic film 152 included in the thin film encapsulating layer 150, and the occurrence of black spots may be reduced by forming the second organic film 154 or the third organic film 156 to have a thickness d2 or d3 greater than the thickness d1 of the first organic film 152 to planarize a step difference caused by the pixel defining film 160.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting display apparatus comprising:
   a substrate;
   a pixel electrode on the substrate;
   an intermediate layer on the pixel electrode and comprising an organic light-emitting layer;
   a facing electrode on the intermediate layer;
   a protective organic film directly contacting the facing electrode; and
   a thin film encapsulating layer on the facing electrode, the thin film encapsulating layer comprising:
      a first inorganic film and a second inorganic film, the first inorganic film being on the protective organic film;
      a first organic film between the first inorganic film and the second inorganic film and having a first thickness; and
      a second organic film on the second inorganic film and having a second thickness greater than the first thickness.

2. The organic light-emitting display apparatus of claim 1, further comprising a blocking layer on the protective organic film.

3. The organic light-emitting display apparatus of claim 1, wherein the first thickness is 1.5 μm or less.

4. The organic light-emitting display apparatus of claim 1, further comprising a pixel defining film covering both edge regions of the pixel electrode and defining a pixel region, wherein the intermediate layer is in the pixel region defined by the pixel defining film and a step difference is generated between the pixel region defined by the pixel defining film and a non-pixel region outside of the pixel region.

5. An organic light-emitting display apparatus comprising:
   a substrate;
   a pixel electrode on the substrate;
   a pixel defining film covering both edge regions of the pixel electrode and defining a pixel region;
   an intermediate layer on the pixel electrode and comprising an organic light-emitting layer;
   a facing electrode on the intermediate layer;
   a protective organic film directly contacting the facing electrode;
   a protective inorganic film directly contacting the protective organic film; and
   a thin film encapsulating layer on the protective inorganic film, the thin film encapsulating layer comprising:
      a first inorganic film directly contacting the protective inorganic film, and a second inorganic film;
      a first organic film between the first inorganic film and the second inorganic film, directly contacting the first inorganic film and the second inorganic film, and having a first thickness; and
      a second organic film directly contacting the second inorganic film and having a second thickness greater than the first thickness,
   wherein the intermediate layer is in the pixel region defined by the pixel defining film and a step difference is generated between the pixel region defined by the pixel defining film and a non-pixel region outside of the pixel region, and
   wherein the first inorganic film, the first organic film, and the second inorganic film are in the pixel region and the non-pixel region along the step difference, and the second organic film is disposed to planarize the step difference.

6. The organic light-emitting display apparatus of claim 1, wherein the substrate is a flexible substrate.

7. The organic light-emitting display apparatus of claim 1, further comprising an optical member on the thin film encapsulating layer.

8. The organic light-emitting display apparatus of claim 2, wherein the blocking layer comprises an inorganic material.

9. The organic light-emitting display apparatus of claim 4, wherein the thin film encapsulating layer further comprises a third inorganic film on the second organic film, and a third organic film on the third inorganic film and having a third thickness greater than the first thickness.

10. The organic light-emitting display apparatus of claim 9, wherein the thin film encapsulating layer further comprises a plurality of additional inorganic films and organic films alternately disposed on the third organic film.

* * * * *